(12) United States Patent
Buer et al.

(10) Patent No.: US 8,705,268 B2
(45) Date of Patent: Apr. 22, 2014

(54) QUANTIFYING THE READ AND WRITE MARGINS OF MEMORY BIT CELLS

(75) Inventors: Myron Buer, Savage, MN (US); Carl Monzel, Eagan, MN (US); Yifei Zhang, Edina, MN (US)

(73) Assignee: Broadcom Corporation, Irvine, CA (US)

( * ) Notice: Subject to any disclaimer, the term of this patent is extended or adjusted under 35 U.S.C. 154(b) by 56 days.

(21) Appl. No.: 13/337,902

(22) Filed: Dec. 27, 2011

(65) Prior Publication Data

US 2013/0163357 A1  Jun. 27, 2013

(51) Int. Cl.
  *G11C 11/00* (2006.01)
  *G11C 29/00* (2006.01)
  *G11C 5/14* (2006.01)
  *G11C 8/00* (2006.01)

(52) U.S. Cl.
  USPC ........... 365/154; 365/156; 365/201; 365/226; 365/230.06

(58) Field of Classification Search
  USPC ................ 365/154, 156, 201, 226, 230.06
  See application file for complete search history.

(56) References Cited

U.S. PATENT DOCUMENTS

| | | | |
|---|---|---|---|
| 6,510,076 B1 * | 1/2003 | Lapadat et al. | 365/154 |
| 6,958,947 B2 | 10/2005 | Park et al. | |
| 8,085,610 B2 | 12/2011 | Kobatake | |
| 8,228,749 B2 * | 7/2012 | Deng et al. | 365/154 |
| 8,270,230 B2 * | 9/2012 | Yamaoka et al. | 365/154 |
| 8,379,467 B2 * | 2/2013 | Deng et al. | 365/201 |

FOREIGN PATENT DOCUMENTS

| | | |
|---|---|---|
| JP | 2010-182344 A | 8/2010 |
| KR | 10-2000-0003481 A | 1/2000 |
| KR | 10-2004-0011835 A | 2/2004 |

OTHER PUBLICATIONS

English language abstract of KR 10-2000-003481 A, Thomson Innovation, http://www.thomsoninnovation.com, accessed Feb. 4, 2014, (listed as document FP1 on the accompanying form PTO/SB/08A).

* cited by examiner

*Primary Examiner* — Trong Phan
(74) *Attorney, Agent, or Firm* — Sterne, Kessler, Goldstein & Fox P.L.L.C.

(57) ABSTRACT

Yield loss from peripheral circuit failure while screening memory arrays for aging effects is prevented by operating the peripheral circuitry at nominal operating voltages during the screening for aging effects. An integrated circuit including one or more memory bit cells, includes circuitry to change the voltage applied to the supply rails of bit cells and the voltage applied to the word-line drivers relative to each other in order to facilitate improved screening for read and write margins. In normal operation the supply rails for word-line drivers and bit cells are nominally the same. In a write margin test mode the voltage on the supply rail of word-line drivers is lower than the voltage on the supply rail of the bit cells. In a read margin test mode the voltage on the supply rail of word-line drivers is higher than the voltage on the supply rail of the bit cells.

20 Claims, 9 Drawing Sheets

QUANTIFYING THE READ AND WRITE MARGINS OF MEMORY BIT CELLS

FIELD OF THE INVENTION

The present disclosure relates generally to integrated circuits, and more particularly relates to built-in circuitry for facilitating read and write margin evaluation for memory circuits.

BACKGROUND

Static Random Access Memory (SRAM) is a well-known and commonly used functional block in digital systems and computers. In operation, data is written to an SRAM, where it is stored in the memory bit cells, and data is read from the memory bit cells and delivered as an output of the SRAM. SRAM is referred to as a volatile memory because once power is removed from the memory, the data stored therein is lost.

Advances in semiconductor manufacturing technologies have enabled the production of increasingly dense and fast SRAM components, or memory chips.

It is noted that "SRAM" is often used to refer to a chip, or integrated circuit, that is primarily a memory device. Those skilled in the art recognize that SRAM not only refers to a memory chip, but also refers to static memory circuitry that is embedded in, and forms a part of, a larger chip, which in turn may have a variety of other circuits and functions. These other circuits may be referred to as peripheral circuits.

Regardless of whether SRAMs are implemented as memory chips or as circuit blocks that are part of larger chips, the circuitry that makes up those memories is typically tested in order to ensure that the product is performing in accordance with its specification.

It is common to test memory circuits in several ways, including but not limited to writing patterns of logical ones and zeroes to the addressable locations of the memory array and reading them back. While such test procedures may verify the functional correctness of the memory circuits, these tests do not necessarily provide a measure of the robustness, or operational margins of the memory under test.

What is needed are methods and apparatus to facilitate evaluation of read and write margins in memory circuits.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION

Figure 1:
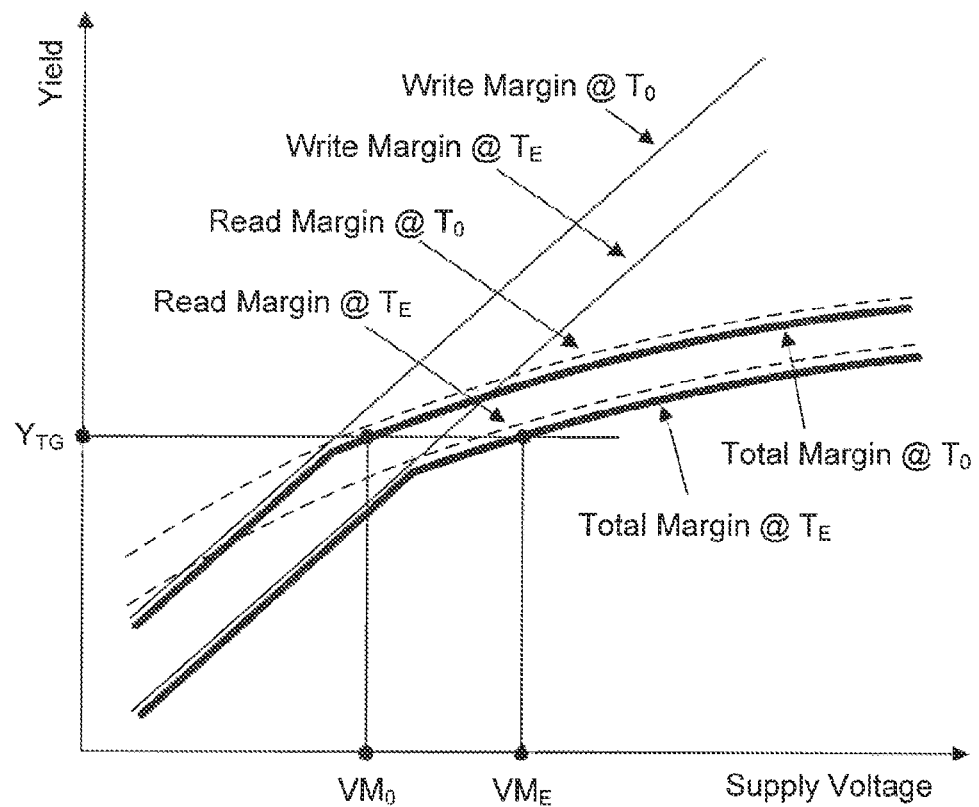
FIG. 1 is a graph showing SRAM bit cell yield curves versus supply voltage early in the lifetime of a product and late in the lifetime of the product.

The following Detailed Description refers to accompanying drawings to illustrate exemplary embodiments consistent with the invention. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

TERMINOLOGY

The terms, chip, die, integrated circuit, semiconductor device, and microelectronic device, are often used interchangeably in the field of electronics. The present invention is applicable to all the above as these terms are generally understood in the field.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of optical, mechanical, magnetic, electrostatic, and electromagnetic interfaces.

DUT refers to a Device Under Test. A DUT as used herein is typically an integrated circuit that is operated so that a determination can be made as to whether the DUT performs according to various parametric and functional specifications.

FET, as used herein, refers to metal-oxide-semiconductor field effect transistors (MOSFETs) as opposed to junction field effect transistors (JFETs). MOSFETs may also be described as insulated gate field effect transistors (IGFETs).

Source/drain terminals refer to the terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The term "gate" is context sensitive and can be used in two ways when describing integrated circuits. As used herein, gate refers to the insulated gate terminal of a three terminal FET when used in the context of transistor circuit configuration, and refers to a circuit for realizing an arbitrary logical function when used in the context of a logic gate. A FET can be viewed as a four terminal device when the semiconductor body is considered.

FPGA refers to a field programmable gate array.

NFET refers to an n-channel FET.

PFET refers to a p-channel FET.

CMOS, as used herein, refers to a circuit that includes at least one NFET and at least one PFET.

The expression "CMOS process" refers to a manufacturing process by which chips containing both NFETs and PFETs are produced.

RAM refers to random access memory. A random access memory is one in which any addressable location can be accessed independently of any previous or subsequent memory transaction.

The expression "bit cell" as used herein refers to the circuitry that stores at least one bit. It is noted that the state of the bit cell represents the data stored therein. Another expression for bit cell is memory cell.

The expression "memory cell" as used herein refers to the circuitry that stores at least one bit. It is noted that the state of the memory cell represents the data stored therein. Another expression for memory cell is bit cell.

SRAM refers to static random access memory. Static memory cells maintain the data stored therein until power is removed, and thus do not need to be refreshed.

The expression "memory transaction" as used herein refers to an operation that accesses at least one addressable memory location and either: (a) stores data therein; or (b) retrieves data therefrom. As used herein, a memory transaction that stores data in the memory is referred to as a write operation, a write transaction, or simply a write. Further, as used herein, a memory transaction that retrieves data from the memory is referred to as a read operation, a read transaction, or simply a read.

The term "nominal" as used to herein is used as a modifier for a specified value and indicates that the specified value is to be interpreted as a range of values including the specified value, wherein that range is determined by the accumulation of normal variances, or tolerances, within physical embodiments. By way of example, the description of a voltage as being nominally 5 Volts, is to be interpreted as meaning that 5 Volts is the design target, and that this voltage is expected to actually be within a range slightly below to slightly above the specified value as determined by the normal accumulation of manufacturing tolerances encountered in actually producing and operating a physical device. Any physical dimension or parametric value included in this disclosure that is intended to have a precision which is more tightly controlled is expressly disclosed herein.

The term "rail" is used herein to refer to a power supply node. Similar related expressions include, but are not limited to, power rail, positive rail, negative rail, and power supply rail. In connection with MOSFETs the power supply rail is typically, but not always, interchangeable with the term $V_{DD}$. As used herein, rail refers to a positive (with respect to ground) power supply node.

$V_M$ is the power supply voltage at which the memory devices are screened to take account of the aging effect.

Many integrated circuits contain significant amounts of memory. Memory chips are integrated circuits having as a primary function, the storage of information, and typically having one or more large memory arrays, and a smaller amount of peripheral circuitry. Non-memory chips with large amounts of embedded memory are also widely manufactured. For example, microprocessors often contain large amounts of memory in order to implement caches. Likewise, System-on-Chip (SoC) devices are examples of products that frequently include large amounts of memory. SRAM-based field programmable gate arrays are another example of integrated circuits with a significant amount of memory bit cells contained therein. In order to make the production of memory chips, as well as chips with embedded memory, economically viable, it is important to be able to reach yield targets that provide profit margins for manufacturers. FIGS. 1-4 are graphs of SRAM bit cell yield curves versus supply voltage early in the lifetime of a product and late in the lifetime of a memory product.

It has been determined that SRAM yield is not only related to process, supply voltage ($V_{DD}$) and operating temperature, but is also related to operational lifetime. Hard manufacturing defects in memory arrays are usually straight forward to detect by writing and reading various patterns of ones and zeroes. On the other hand soft defects may not manifest themselves until the memory has been operated for some period of time. These soft defects have been found to result, at least in part, due to small, or negative, bit cell margins. Without adequate margin, failure of the memory is likely to occur due to shifts in the electrical characteristics of memory bit cells that occur due to voltage and temperature stresses.

Two of the margins that are significant in terms of their impact on SRAM yield are read margin and write margin. It has been found that both read and write margins shift over time due to $V_{DD}$ and temperature stress during operation. These shifts are referred to herein as the aging effect. The magnitude of the shifts depends on the magnitude and duration of the applied voltage and temperature stresses. Memory chips, and chips with embedded memory, are used in a wide variety of applications, and consequently in a wide variety of operating environments, and therefore after factory testing these chips experience different stresses. In view of the foregoing, it is noted that without appropriate characterization of memory read margins and memory write margins, some chips that will fail after some time in an operational environment will nonetheless pass a conventional screening.

Conventional testing, or screening, of memories does not target the read and write margins separately. This lack of separate characterization of read and write margins is problematic as described in more detail below.

FIGS. 1-4 are typical yield margin plots vs. $V_{DD}$ at $T_0$ (early lifetime) and $T_E$ (late lifetime) for memory read margins and memory write margins. The vertical axes are yield expressed in number of sigma ($\sigma$) based on a normal distribution. For instance, 6$\sigma$ indicates a failure rate of 1 in 1 billion (the larger $\sigma$ is, the better the yield). In some instances the minimum operating voltage is determined by the read margin, and in other instances the minimum operating voltage is determined by the write margin.

Figure 2:
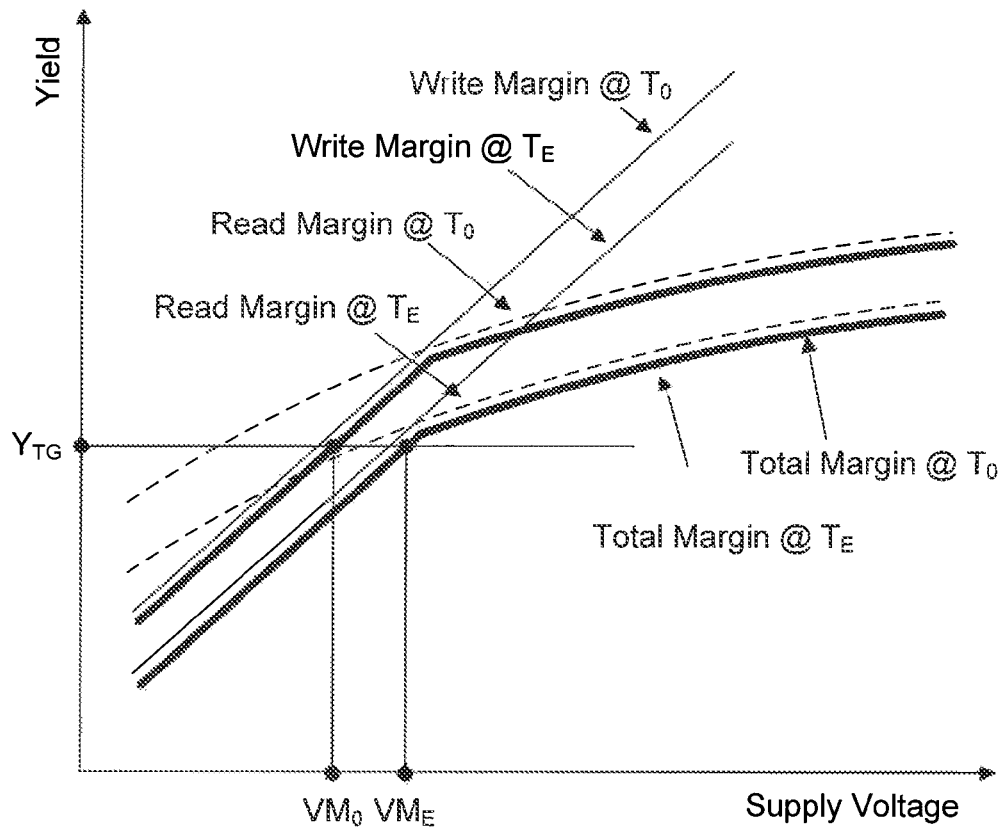
FIG. 2 is another graph showing SRAM bit cell yield curves versus supply voltage early in the lifetime of a product and late in the lifetime of the product.
Figure 3:
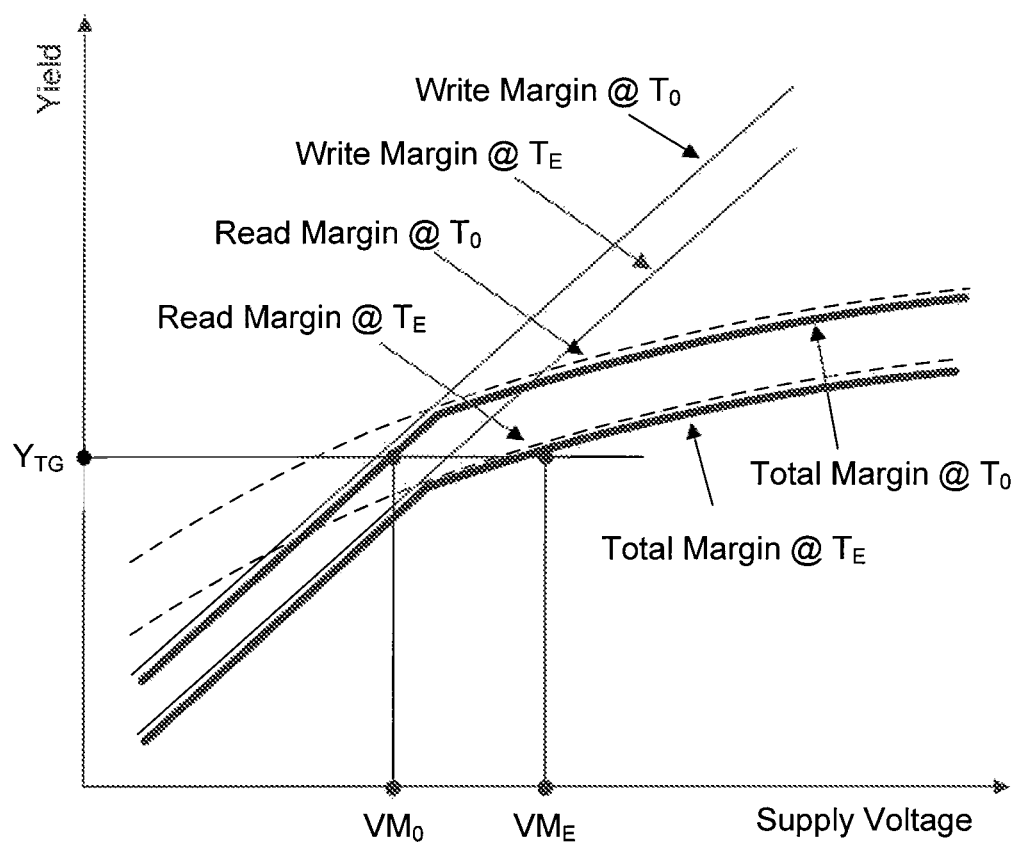
FIG. 3 is another graph showing SRAM bit cell yield curves versus supply voltage early in the lifetime of a product and late in the lifetime of the product.
Figure 4:
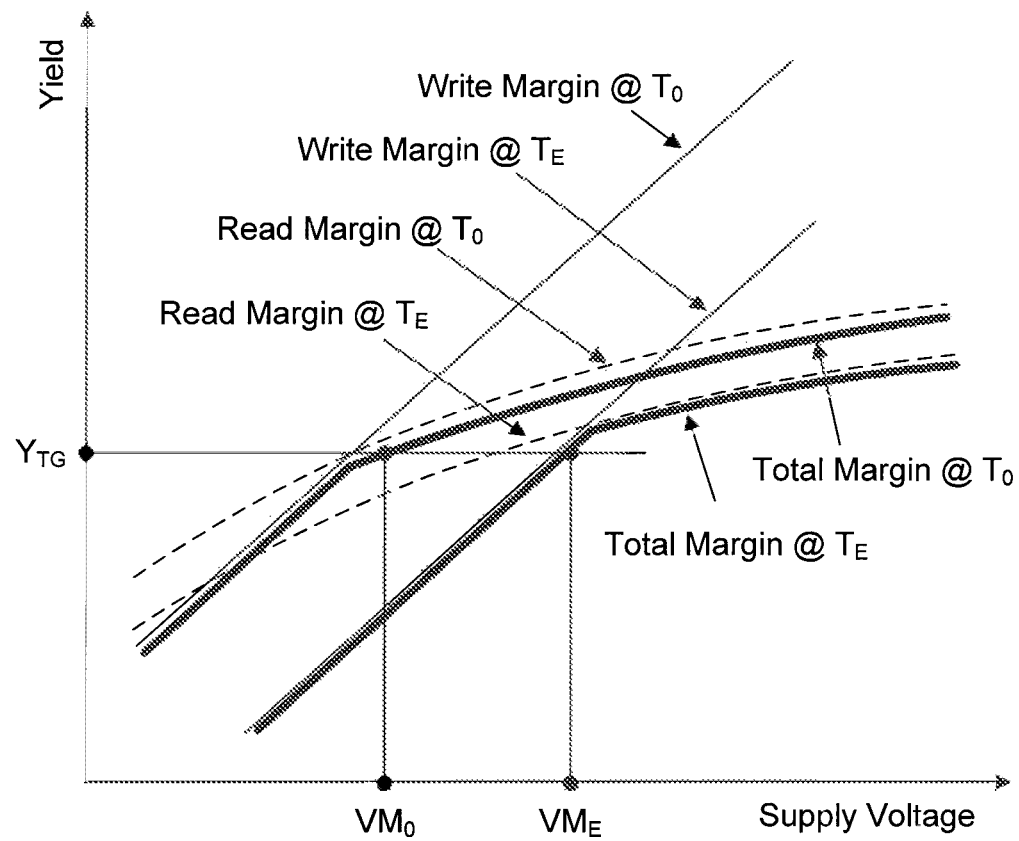
FIG. 4 is another graph showing SRAM bit cell yield curves versus supply voltage early in the lifetime of a product and late in the lifetime of the product.

The cross supply voltage point where $Y_{TG}$ intercepts the margin curves defines the minimum operating voltage ($V_M$) for the targeted yield ($V_{Mr}$ for the read and $V_{Mw}$ for the write). The total margin is the worst case margin of read and write. FIG. 1 shows that both $V_{M0}$ ($V_M$ at $T_0$) and $V_{ME}$ ($V_M$ at $T_E$) at the targeted yield ($Y_{TG}$) are due to the read margin. In this case, screening at the $VM_0$ will be sufficient for the $V_{ME}$ with the same $Y_{TG}$ without over and under-screening. FIG. 2 shows a similar case except that the write margin dominates the total margin curve at both $T_0$ and $T_E$. FIGS. 3-4 show the cases where the total margin is not dominated by one margin at both $T_0$ and $T_E$. FIG. 3 shows at $T_0$, $V_{M0}$ is equal to $V_{Mw0}$ and at $T_E$, $V_{ME}$ is equal to the $V_{MRE}$. Screening at $V_{Mw0}$ will under-screen the bit cells with read margin fails and screening at $V_{Mr0}$ will over-screen the bit cells with write margin fails. FIG. 4 shows a similar case except that the role of read and write margin has been swapped. As memory design and manufacturing technology advance, it has been found that the read and write margins have been decreasing, thus making the situations represented in FIGS. 3 and 4 more common. Conventional memory screening is no longer adequate to address the situations represented in FIGS. 3 and 4.

Various embodiments of the present disclosure provide for separate memory read margin and memory write margin screening without incurring complex changes to on-chip memory built-in self-test circuitry. Advantageously, memory screening in accordance with the present disclosure can be performed at full speed.

Figure 5:
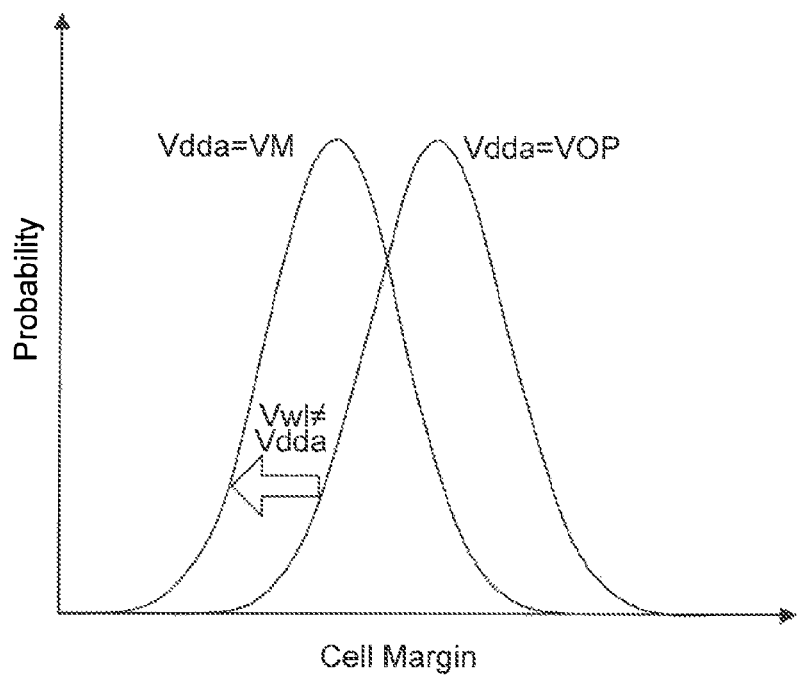
FIG. 5 is a graph showing a pair of cell margin probability density plots at different voltages.

The typical margin distribution is plotted in FIG. 5. One distribution is at normal operating voltage and the other one is at the $V_M$, which is the power supply voltage at which the memory devices are screened to take account of the aging effect. Unfortunately, screening the memory devices at this lower power supply voltage requires that all the peripheral circuitry also works properly at this guard-banded voltage. There is typically some yield loss associated with operating the peripheral circuitry at the power supply voltage that is only meant for testing the memory array.

FIG. 5 is a plot showing two cell margin probability density curves. The curve on the left of the plot is obtained when the memory array is provided with the minimum operating voltage, while the curve on the right of the plot is obtained when the memory array is provided the normal (i.e., specified nominal) operating voltage. It is noted that by biasing the output of the word line driver $V_{WL}$ to be higher or lower than the memory array supply voltage, $V_{DDA}$, the cell margin probability density function at $V_M$ may be closely reproduced at $V_{DDA}=V_{OP}$, thus reducing design constraints on the peripheral circuits that share the chip with the memory under test. It will be understood that reducing the circuit design constraints for the peripheral circuits typically results, advantageously, in reduced engineering costs.

In accordance with the present disclosure, integrated circuits including memory are operated at the normal, i.e., nominally specified power supply voltage, and the power supply voltage to the wordline drivers ($V_{WL}$) is biased to be different relative to the power supply voltage of the memory array ($V_{DDA}$) in order to shift the bit cell margin distribution to more closely resemble the bit cell margin distribution at $V_M$. For the read margin screening, $V_{WL}$ is biased higher relative to $V_{DDA}$ to make an undesired state change in the bit cell (flipping) easier, thus shifting the read margin distribution down. For write margin screening, $V_{WL}$ is biased lower relative to $V_{DDA}$ to make writing the bit cell more difficult to achieve.

Overview.

The yield loss that results from peripheral circuit failure while screening memory arrays for aging effects by performing read and write margin testing at a minimum operating voltage is reduced or eliminated by operating the peripheral circuitry at nominal operating voltages during the screening for aging effects. The minimum operating voltage of the memory determined by read and write margin testing gives an indication of the long term reliability of the device under test.

In accordance with the present disclosure, an integrated circuit including one or more static memory bit cells, is provided with circuitry to change the voltage applied to the supply rails of the bit cells and the voltage applied to the word-line drivers relative to each other in order to facilitate improved screening for read and write margins. In normal operation the supply rails for the word-line drivers and the bit cells are nominally the same. In a write margin test mode in accordance with the present disclosure, the voltage on the supply rail of the word-line drivers is lower than the voltage on the supply rail of the bit cells. In a read margin test mode the voltage on the supply rail of the word-line drivers is higher than the voltage on the supply rail of the bit cells. Table 1, shown below, summarizes the application of these voltages in accordance with the present disclosure. In Table 1, $V_{DDW}$ is the supply rail for the word-line driver circuit, and $V_{DDA}$ is the supply rail for the bit cell.

TABLE 1

| Mode | Word-line Driver Supply Rail ($V_{DDW}$) |
| --- | --- |
| Normal | $V_{DDW} = V_{DDA}$ |
| Test, Write | $V_{DDW} < V_{DDA}$ |
| Test, Read | $V_{DDW} > V_{DDA}$ |

Illustrative Memory and Test Logic Circuits

Illustrative circuitry for performing read and write margin screening in accordance with the present disclosure uses a dual power supply and one voltage regulator. As described in greater detail below, the memory array and the peripheral circuitry are powered by a first power supply, and the word-line driver is powered by the output of a selector circuit. For write margin screening the word-line driver receives a power supply voltage that is less than the supply voltage of the memory array. For read margin screening, the word-line driver receives a power supply voltage that is greater than the supply voltage of the memory array. In normal operation, the word-line drivers and the memory array receive a power supply voltage that is nominally the same.

Figure 6:
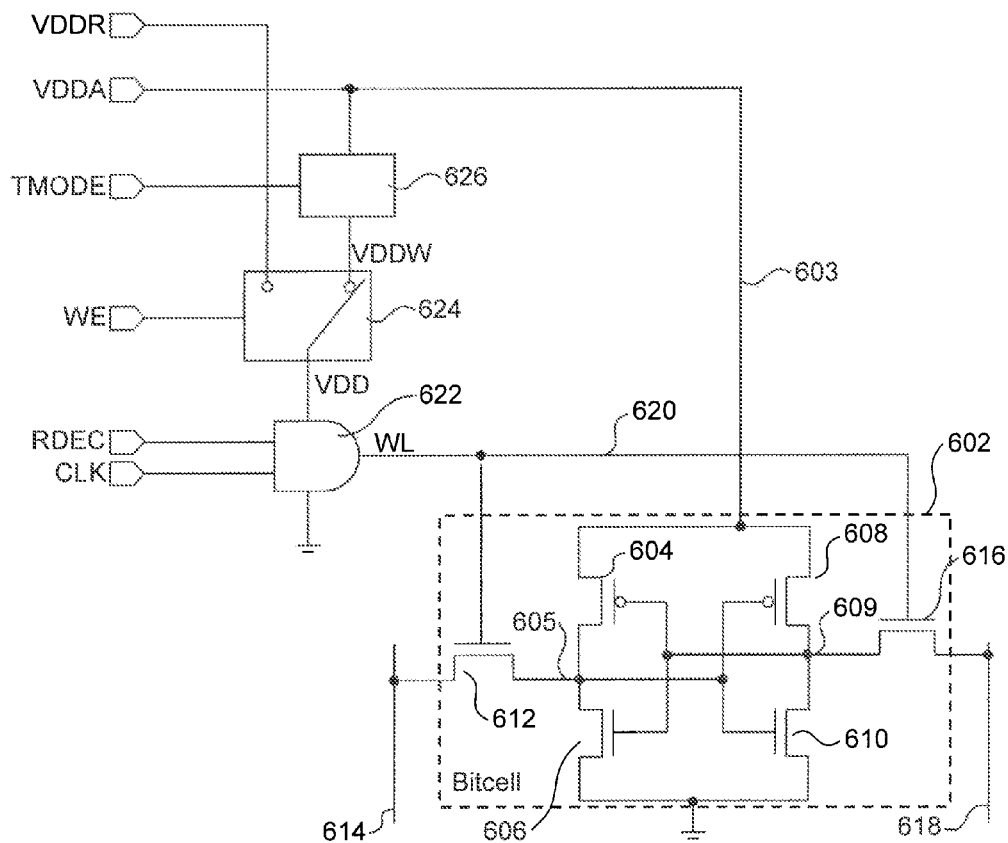
FIG. 6 is a schematic diagram of a circuit using dual power supplies for read and write margin screening of a static memory bit cell.

FIG. 6 is a schematic representation of an illustrative embodiment showing power supply switching circuitry coupled to an exemplary static memory bit cell 602. In this illustrative embodiment there are two external power supply voltages and one voltage regulator which together provide the three voltages used to support read margin test, write margin test, and normal memory transactions in accordance with the present disclosure. It is to be understood that although one bit cell is illustrated, typical memories contain a plurality of bit cells.

The plurality of bit cells in typical memories are commonly arranged in an array of rows and columns. The plurality of bit cells so arranged may be referred to as a memory array. An address decoder (not shown in FIG. 6) is commonly associated with the memory array. An address is presented to the address decoder and the appropriate bit cells are made available for a memory transaction. The rows of a memory array are selected by a signal decoded from the address. The portion of the address decoder that generates a row select, or row decode, signal may be referred to as the row decoder. The row select signal is delivered to the memory array by an electrically conductive pathway often referred to in this field as the word-line. Some memory arrays further require the selection of one or more columns of bit cells from the memory array. The portion of the address decoder that generates a column select signal may be referred to as the column decoder. The details of address decoder circuitry are well-known in this field and are not further described herein.

Bit cell 602 is a CMOS circuit referred to as a six-transistor static memory bit cell, and it is formed of cross-coupled CMOS inverters, with each inverter further coupled to a respective bit line through a corresponding access transistor, and the access transistors sharing a common word-line. More particularly, a first PFET 604 is coupled source-to-drain between a power supply node 603 and a first intermediate node 605; a first NFET 606 is coupled drain-to-source between first intermediate node 605 and ground; a second PFET 608 is coupled source-to-drain between power supply node 603 and a second intermediate node 609; a second NFET 610 is coupled drain-to-source between second intermediate node 609 and ground; a third NFET 612 is coupled drain-to-source between intermediate node 605 and a first bit line 614; and a fourth NFET 616 is coupled drain-to-source between intermediate node 609 and a second bit line 618. NFETs 612 and 616 are the access transistors in this illustrative configuration.

It is noted that PFET 604 and NFET 606 form a first inverter, and PFET 608 and NFET 610 form a second inverter. The gates of PFET 604 and NFET 606 are coupled to each other, and are further coupled to intermediate node 609, which is the output node of the second inverter. The gates of PFET 608 and NFET 610 are coupled to each other, and are further coupled to intermediate node 605, which is the output node of the first inverter. The gates of third NFET 612 and fourth NFET 616 are both coupled to a node 620. Node 620 is also referred to herein as the word-line.

Still referring to FIG. 6, a word-line driver circuit 622 is shown with an output terminal coupled to node 620, i.e., the word-line. In this illustrative embodiment, word-line driver circuit 622 is shown as a two-input AND gate, with a first input terminal coupled to a row decode signal source (not shown), and a second input terminal coupled to clock signal source (not shown). The output of the row decode signal source is referred to as RDEC, and the output of the clock signal source is referred to as CLK. It is noted that illustrative word-line driver circuit 622 is: (a) asserted when both the row decode signal RDEC and the clock signal CLK are asserted (i.e., in a logical high state); (b) designed to charge and discharge word-line 620 in accordance with a predetermined timing specification; and (c) coupled to a positive voltage supply rail through a selector 624.

When word-line 620 is asserted (in this case driven to a voltage high enough to turn on NFETs 612 and 616) there is an electrically conductive path established between the output of the first inverter, node 605, and bit line 614; and an electrically conductive path established between the output of the second inverter, node 609, and bit line 618. In this state, NFET 612 provides input/output (I/O) access between bit line 614 and bit cell 602, and NFET 616 provides I/O access between bit line 618 and bit cell 602.

Depending on the state of bit lines 614 and 618 when access transistors 612 and 616 are turned on, bit cell 602 is either read or written. For example, if bit lines 614 and 618 are pre-charged to an intermediate voltage level (thus nominally at equal voltages), bit line pre-charge circuits turned off, and NFETs 612 and 616 are turned on, then bit cell 602 drives the bit lines so that one bit line is at least slightly higher and the other bit line is at least slightly lower than the intermediate voltage. The difference between the bit line voltages is sensed by circuitry coupled to the bit lines, and the state of bit cell 602 is thereby determined. A sense amplifier may be coupled to the bit lines (either directly or through a column decoder). The sense amplifier outputs a zero or a one depending on the difference in voltage between the bit lines. There are many well-known sense amplifier circuit configurations, and the present invention is not limited to any particular sense amplifier. Indeed, memory arrays with only a small number of bits, or with a long time available to read data, may have data read directly from the bit lines without the aid of a sense amplifier. Presenting an address and receiving data from the memory location(s) specified by the address constitutes a memory transaction, and more specifically constitutes a memory read operation.

In a memory write operation, the address presented to the address decoder is used to select the bit cell(s) to be written by enabling a selected pair of bit lines to be driven with the write data (one bit line with true data and the other bit line with inverted data), and by driving the word-line to a voltage that turns on the access transistors of the selected bit cell(s). In this state, the bit cell is flipped if the stored data is different that the data being written, and the bit cell remains unchanged if the stored data is the same as the data being written.

Although the illustrative circuitry described above uses a bit cell coupled to a single pair of bit lines by access transistors sharing a common word-line, it is noted that various multi-ported bit cell arrangements are known and that such multi-ported arrangements also benefit from read margin and write margin screening in accordance with the present disclosure.

Still referring to FIG. 6, selector 624 is configured to select one of two power supply sources as a function of the state of a Write Enable signal (WE). A first power supply source, $V_{DDR}$, is coupled to a first input terminal of selector 624, and a second power supply source $V_{DDW}$ is coupled to a second input terminal of selector 624. Selector 624 provides an electrically conductive pathway between the selected power supply source and an output terminal. The power supply rail of word-line driver 622 is connected to the output terminal of selector 624. WE is connected to a third input terminal of selector 624. When WE is in a first state, power supply source $V_{DDR}$ is selected, and when WE is in a second state, power supply source $V_{DDW}$ is selected. More particularly, when WE is asserted (i.e., a memory write operation is to be performed), $V_{DDW}$ is selected, and at other times (i.e., a memory read operation is to be performed) $V_{DDR}$ is selected.

$V_{DDW}$ is an output of voltage regulator 626. A first input terminal of voltage regulator 626 is coupled to power supply source $V_{DDA}$. $V_{DDA}$ is also the power supply source for the memory array and is coupled to the power supply rail of the bit cell(s). A Test Mode (TMODE) signal source (not shown) is coupled to a second input terminal of voltage regulator 626. When TMODE is in a first state, voltage regulator 626 provides a voltage nominally equal to the voltage of $V_{DDA}$. When TMODE is in a second state, voltage regulator 626 provides a voltage that is lower than the voltage of $V_{DDA}$. By way of example, and not limitation, TMODE is a logical zero when normal memory transactions are to be performed (i.e., not in test mode), and TMODE is a logical one at least when write margin screening is to be performed. During normal memory transactions, the supply rails of the bit cells and the word-line drivers are set to be the same or nominally the same voltage. Table 2, shown below, summarizes the relationship between Write Enable, Test Mode, and the voltage source to which word-line driver 622 is driven when asserted in the illustrative embodiment of FIG. 6.

TABLE 2

| TMODE | WE | Word-Line Driver Supply Rail ($V_{DDW}$) | Bit Cell Supply Rail ($V_{DDA}$) |
|---|---|---|---|
| 0 | 0 | $V_{DDW} = V_{DDA}$ | $V_{DDA}$ |
| 0 | 1 | $V_{DDW} = V_{DDA}$ | $V_{DDA}$ |
| 1 | 0 | $V_{DDW} = V_{DDR}$ | $V_{DDA}$ |
| 1 | 1 | $V_{DDW} < V_{DDA}$ | $V_{DDA}$ |

Figure 7:
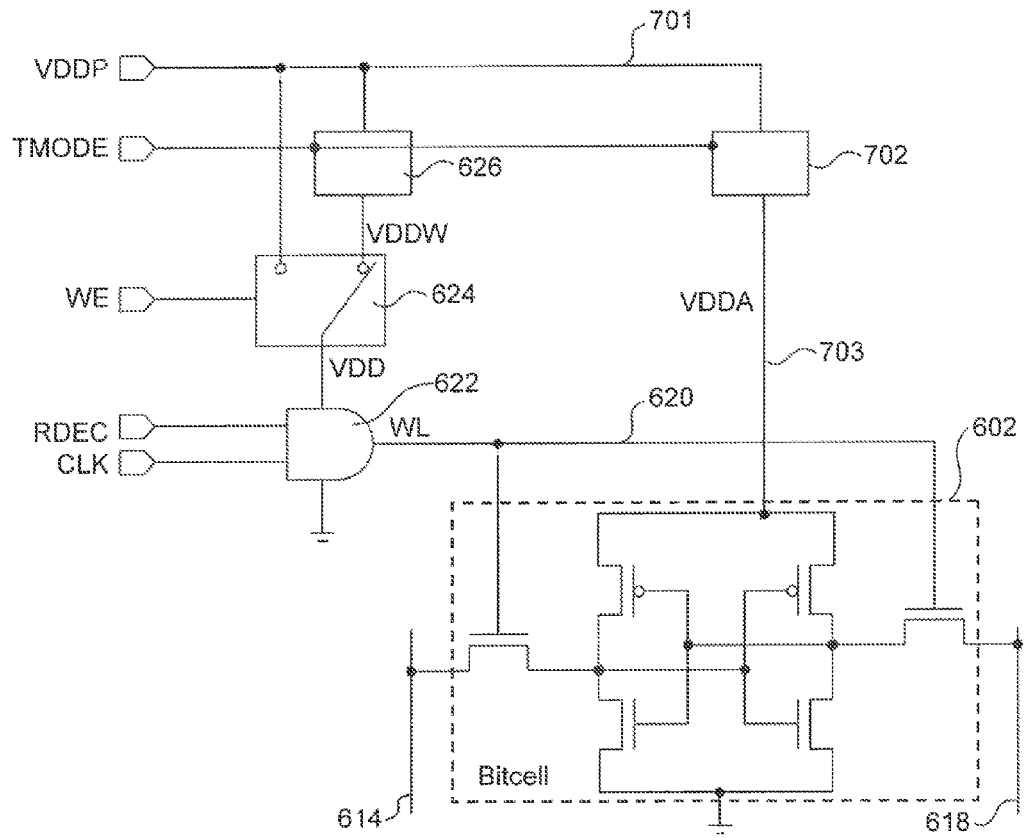
FIG. 7 is a schematic diagram of a circuit using a single power supply for read and write margin screening of a static memory bit cell.

FIG. 7 is a schematic representation of an illustrative embodiment showing power supply switching circuitry coupled to an exemplary static memory bit cell 602. As noted above, it is to be understood that although one bit cell is illustrated, typical memories contain a plurality of bit cells.

In this illustrative embodiment, circuitry for read margin and write margin screening uses a single external power supply and two voltage regulators.

The illustrative embodiment shown in FIG. 7 is similar to that shown in FIG. 6, but in this case, there is one externally supplied voltage, and two voltage regulators, which together provide the three voltages used to support read margin test, write margin test, and normal memory transactions. More particularly, a first power supply source 701 provides a voltage, $V_{DDP}$, and is coupled to a first input terminal of selector 624, a first input terminal of voltage regulator 626, and a first input terminal of a second voltage regulator 702. Voltage regulators 626 and 702 each have a second input terminal that is coupled to a Test Mode signal source (TMODE). An output terminal of first voltage regulator 626 provides a voltage $V_{DDW}$, and is coupled to a second input terminal of selector 624. An output terminal of second voltage regulator 702 provides a voltage, $V_{DDA}$, and is coupled to a supply rail 703 of bit cell 602.

When TMODE is asserted, the relationship between $V_{DDW}$, $V_{DDA}$, and $V_{DDP}$, is as follows: $V_{DDW} < V_{DDA} < V_{DDP}$. When TMODE is not asserted, the relationship between $V_{DDW}$, $V_{DDA}$, and $V_{DDP}$, is as follows: $V_{DDW} = V_{DDA} = V_{DDP}$ In normal operation, i.e., not in test mode, the voltage applied on node 620 when the word-line is asserted is nominally equal to the voltage applied to bit cell supply rail 703. In test mode, i.e., when TMODE is asserted, a read margin test operation can be performed when the write enable signal, WE, is non-asserted, and a write margin test operation can be performed when WE is asserted.

During a read margin test operation, word-line driver 622 drives word-line 620 to a voltage greater than the voltage provided to the bit cell supply rail 703. In the illustrative embodiment of FIG. 7, during a read margin test operation, the asserted word-line is driven to the external supply voltage $V_{DDP}$, while the bit cell supply rail receives a lesser voltage from second voltage regulator 702.

During a write margin test operation, when the word line 602 is asserted, word-line driver 622 drives word-line 620 to a voltage that is lower than the voltage provided to the bit cell supply rail 703. In the illustrative embodiment of FIG. 7, during a write margin test operation, the asserted word-line is driven to the voltage $V_{DDW}$, which is sourced by the output terminal of first voltage regulator 626 and provided through selector 624. During this period of time the bit cell supply rail receives a higher voltage, $V_{DDA}$, from the output terminal of second voltage regulator 702. Table 3, shown below, summarizes the relationship between Write Enable, Test Mode, and the voltage source to which word-line driver 622 is driven when asserted in the illustrative embodiment of FIG. 7.

TABLE 3

| TMODE | WE | Word-Line Driver Supply Rail ($V_{DDW}$) | Bit Cell Supply Rail ($V_{DDA}$) |
|---|---|---|---|
| 0 | 0 | $V_{DDW} = V_{DDP}$ | $V_{DDA} = V_{DDP}$ |
| 0 | 1 | $V_{DDW} = V_{DDP}$ | $V_{DDA} = V_{DDP}$ |
| 1 | 0 | $V_{DDW} = V_{DDP}$ | $V_{DDA} < V_{DDW} < V_{DDP}$ |
| 1 | 1 | $V_{DDW} < V_{DDP}$ | $V_{DDA} = V_{DDP}$ |

It is well-known that operating voltages for integrated circuits generally tend to decrease as the physical dimensions of electrical circuit elements, such as but not limited to transistors and capacitors, are reduced. The present invention is not limited to any particular set of physical dimensions on an integrated circuit, and is not limited to any particular operating voltages. Further, the present invention is not limited to any particular voltage values during read margin and write margin testing, but rather only to the relationship between the bit cell power rail and the drive voltage applied to the bit cell access transistors described herein.

In an alternative embodiment, the word-line driver circuit is bootstrapped. Bootstrapped word-line drivers are well-known in the field of memory circuits. Such word-line drivers couple extra charge onto the output node of the driver thereby raising the output voltage above the power supply voltage. Bootstrapped word-line drivers were introduced in the past as a mechanism to increase the gate drive on the access transistors of the bit cell. With this increased gate drive, the on-resistance of the access transistors is advantageously reduced. Various embodiments that use bootstrapped word-line drivers maintain the bootstrap function for read margin testing. Whereas for the write margin testing, the bootstrap function must be accounted for. In one embodiment the bootstrap circuitry in the word-line driver is disabled during write margin testing. In another embodiment, the bootstrap circuitry of word-line driver remains enabled but the voltage provided by the first voltage regulator is lower to compensate for the voltage boost of the bootstrap. In a further alternative, the bootstrap circuitry is only partially disabled, so that a voltage boost occurs, but is smaller than in normal mode because a smaller amount of charge is coupled onto the word line driver output node.

It is noted that some circuitry that is commonly, but not necessarily, associated with the memory array, such as bit line pre-chargers, bit line equalizers, bit line drivers, and sense amplifiers may have some effect on read and/or write margins. In various embodiments the first and second voltage regulators are provided on-chip with the memory array to reduce unwanted voltage variations in the difference between the voltage regulator outputs. In some embodiments, the voltage regulators are disposed on-chip so as to be physically adjacent to the memory array and word-line drivers.

Figure 8:
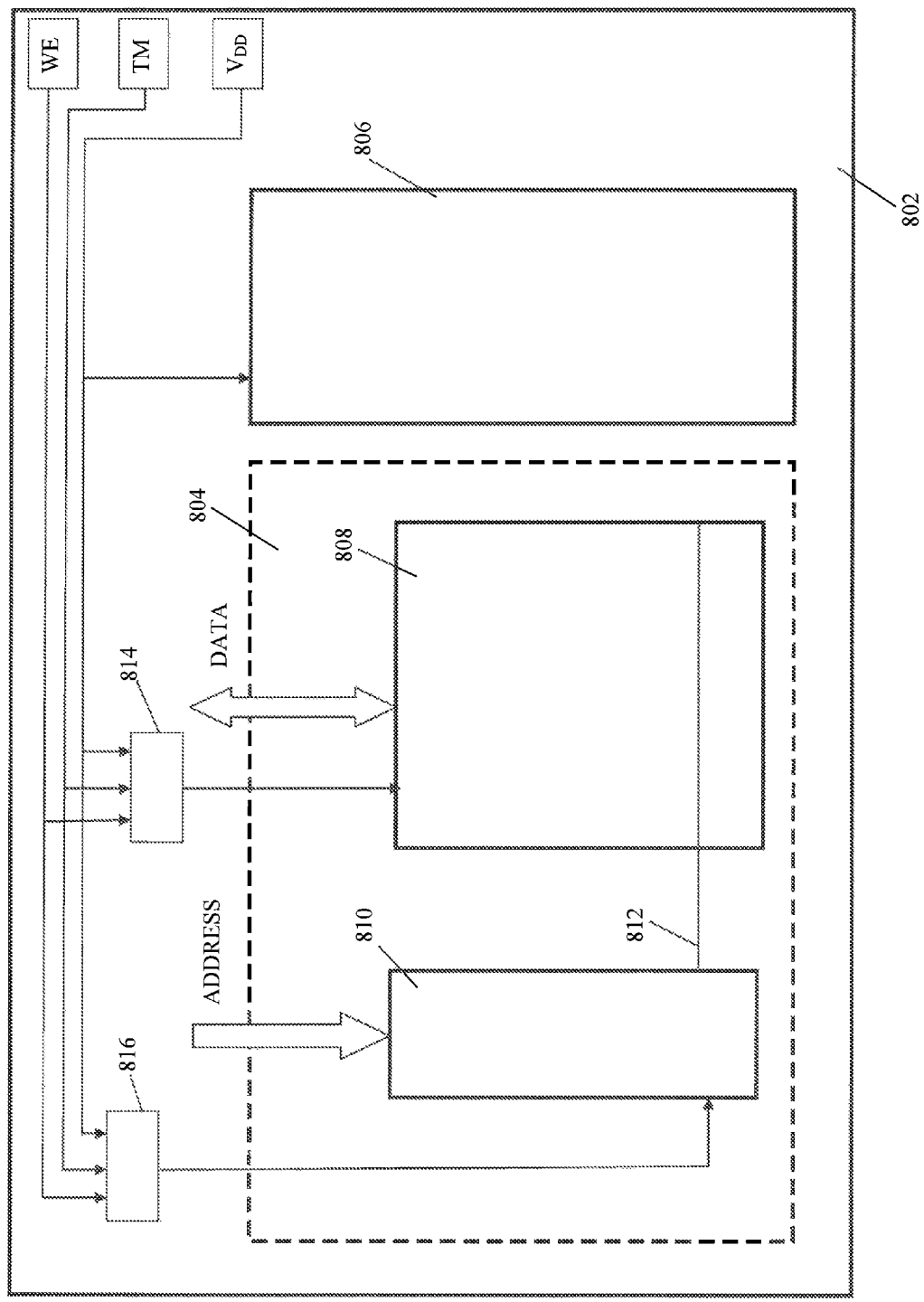
FIG. 8 is a generalized high-level block diagram of an integrated circuit having a memory section, a peripheral circuitry section, and control circuitry for biasing the operating voltage of the word-lines and the bit cells relative to each other without changing the operating voltage of the peripheral circuitry in accordance with the present disclosure.

FIG. 8 shows a generalized high-level block diagram of an integrated circuit having a memory section, a peripheral circuitry section, and control circuitry for biasing the operating voltage of the word-lines and the bit cells relative to each other without changing the operating voltage of the peripheral circuitry in accordance with the present disclosure. More particularly, FIG. 8 illustrates the relationship, in terms of supply voltage sources, between memory and peripheral circuitry on an integrated circuit in accordance with the present disclosure. More particularly, an integrated circuit 802 includes a memory 804 and a block of peripheral circuitry 806. Memory 804 includes a memory array 808, an address decoder 810, and a word-line 812. It will be appreciated that memory 804 is illustrative, and that various embodiments may include a plurality of word-lines, each of those word-lines being asserted in response to the decoding of an address presented to address decoder 810. Memory array 808 is made up of a plurality of bit cells. In the illustrative embodiments described herein, the bit cells are CMOS static bit cells such as bit cell 602. FIG. 8 further shows a voltage source VDD, a Test Mode signal source TM, and a Write Enable signal source WE. Peripheral circuitry block 806 is coupled to voltage source VDD. A first voltage supply control circuit 814, and a second voltage supply control circuit 816 are each coupled to receive VDD, Test Mode, and Write Enable as inputs, and to respectively produce as outputs the operating voltage supply for the memory array, and the operating voltage supply for the word-line drivers.

As described in conjunction with the illustrative embodiments of FIGS. 6 and 7, the illustrative embodiment of FIG. 8 shows that the operating voltage provided to the memory array and the word-line drivers of the address decoder is selected or generated based at least in part on whether normal memory transactions are being performed, or test mode read and test mode write transactions are being performed. In accordance with the present disclosure, circuitry that is not associated with test mode operation of the memory may continue to operate with an operating voltage independent of that used within the memory array or the word line drivers.

Figure 9:
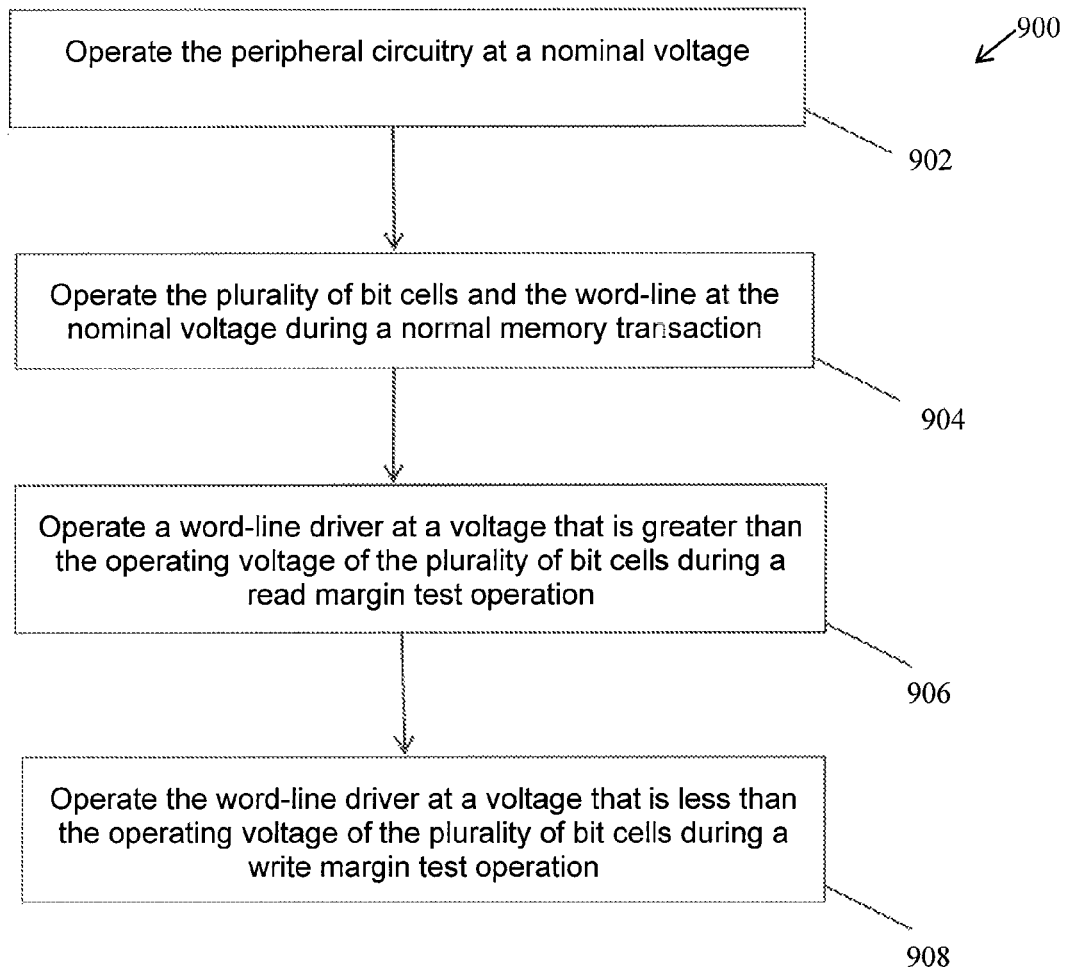
FIG. 9 is a flow diagram of a process in accordance with the present disclosure.

Referring to FIG. 9, one illustrative method 900 of operating an integrated circuit having peripheral circuitry and having a memory array including a plurality of bit cells and at least one word-line coupled to the plurality of bit cells, includes operating 902 the peripheral circuitry at a nominal voltage; operating 904 the plurality of bit cells and the word-line at the nominal voltage during a normal memory transaction; operating 906 a word-line driver at a voltage that is greater than the operating voltage of the plurality of bit cells during a read margin test operation; and operating 908 the word-line driver at a voltage that is less than the operating voltage of the plurality of bit cells during a write margin test operation.

In another illustrative embodiment, a method of operating an integrated circuit having a memory therein, includes providing an output of a first voltage source to a supply rail of each of a plurality of bit cells; and providing an output of a second voltage source to a supply rail of at least one word-line driver; wherein the voltage of the output of the second voltage source is lower than the voltage of the output of the first voltage source during a write margin test operation; wherein the voltage of the output of second voltage source is greater than the voltage of the output of the first voltage source during a read margin test operation; and wherein the voltage of the output of the first voltage source and the voltage of the output of the second voltage source are nominally equal during a normal memory transaction.

In another illustrative embodiment, a circuit, includes at least one bit cell having a first input/output (I/O) terminal switchably coupled to a first bit line, the switchable coupling of the first I/O terminal to the first bit line controlled by a state of a word-line, and a second I/O terminal switchably coupled to a second bit line, the switchable coupling of the second I/O terminal to the second bit line controlled by the state of the word-line; a word-line driver having an output terminal coupled to the word-line; a selector having a first input terminal coupled to a first power supply node, a second input terminal coupled to a second power supply node, a third input terminal coupled to a first control signal source, and an output terminal coupled to a supply rail of the word-line driver; and a voltage regulator having a first input terminal coupled to a third power supply node, a second input terminal coupled to a second control signal source, and an output terminal coupled to the second power supply node.

It is noted that the screening methods in accordance with the present disclosure also cover margins at different operating conditions such as temperature in addition to the aging effect. Typically the SRAM write margin increases with temperature and the SRAM read margin decreases with temperature. To cover the worst case of both read margin and write margin, requires screening at two different conditions. However, since screening methods in accordance with the present disclosure target the read and write margins separately, such methods cover both the aging and operating conditions by tuning different voltage deltas between the wordline and the array power.

CONCLUSION

It is intended that the Detailed Description section, and not the Abstract of the Disclosure, is to be used to interpret the claims. The Abstract of the Disclosure is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described examples or illustrative embodiments, but should be defined only in accordance with the subjoined Claims and their equivalents.

What is claimed is:

1. A circuit, comprising:
at least one bit cell having a first input/output (I/O) terminal coupled to a first bit line, a coupling of the first I/O terminal to the first bit line controlled by a state of a word-line, and a second input/output (I/O) terminal coupled to a second bit line, a coupling of the second I/O terminal to the second bit line controlled by the state of the word-line;
a word-line driver having an output terminal coupled to the word-line;
a selector having a first input terminal coupled to a first power supply node, a second input terminal coupled to a second power supply node, a third input terminal coupled to a first control signal source, and an output terminal coupled to a supply rail of the word-line driver; and
a voltage regulator having a first input terminal coupled to a third power supply node, a second input terminal coupled to a second control signal source, and an output terminal coupled to the second power supply node.

2. The circuit of claim 1, wherein the at least one bit cell includes a power supply rail coupled to the third power supply node.

3. The circuit of claim 1, wherein the first control signal source provides a first control signal that is in a first state for a memory write operation, and in a second state for a memory read operation; and wherein the second control signal source provides a second control signal that is in a first state for a test mode operation and in a second state for a normal memory transaction.

4. The circuit of claim 1, wherein the selector is configured, responsive to the first control signal source being in a first state, to couple the first power supply node to the output terminal of the selector, and responsive to the first control signal source being in a second state, to couple the second power supply node to the output terminal of the selector.

5. The circuit of claim 4, wherein the first state of the first control signal source indicates that a read operation is to be performed, and the second state of the first control signal source indicates that a write operation is to be performed.

6. The circuit of claim 1, wherein the voltage regulator is configured, responsive to a first state of a test mode signal to provide a first voltage and responsive to a second state of the test mode signal to provide a second voltage.

7. The circuit of claim 1, further comprising a peripheral circuit.

8. The circuit of claim 7, wherein the peripheral circuit is coupled to a supply voltage that is independent of the state of the test mode signal.

9. The circuit of claim 1, wherein the word-line driver is bootstrapped during normal memory transactions.

10. The circuit of claim 9, wherein the bootstrapping function is disabled during at least one of a memory read margin test or a memory write margin test.

11. A method of operating an integrated circuit having a peripheral circuit and having a memory array including a plurality of bit cells and at least one word-line coupled to the plurality of bit cells, comprising:
 operating the peripheral circuit at a nominal voltage;
 operating the plurality of bit cells and the word-line at the nominal voltage during a normal memory transaction;
 operating a word-line driver at a voltage that is greater than an operating voltage of the plurality of bit cells during a read margin test operation; and
 operating the word-line driver at a voltage that is less than the operating voltage of the plurality of bit cells during a write margin test operation.

12. The method of claim 11, further comprising:
 determining, by a circuit disposed within the integrated circuit, whether the read margin test operation is to be performed.

13. The method of claim 11, further comprising:
 determining, by a circuit disposed within the integrated circuit, whether the write margin test operation is to be performed.

14. The method of claim 11, wherein the bit cells are static bit cells.

15. The method of claim 11, wherein the word-line is coupled to at least one access transistor of at least one bit cell.

16. A method of operating an integrated circuit including a memory, comprising:
 providing an output of a first voltage source to a supply rail of each of a plurality of bit cells; and
 providing an output of a second voltage source to a supply rail of at least one word-line driver;
 wherein a voltage of the output of the second voltage source is lower than a voltage of the output of the first voltage source during a write margin test operation;
 wherein the voltage of the output of the second voltage source is greater than the voltage of the output of the first voltage source during a read margin test operation; and
 wherein the voltage of the output of the first voltage source and the voltage of the output of the second voltage source are nominally equal during a normal memory transaction.

17. The method of claim 16, further comprising:
 determining, by a circuit disposed within the integrated circuit, whether the read margin test operation is to be performed.

18. The method of claim 16, further comprising:
 determining, by a circuit disposed within the integrated circuit, whether the write margin test operation is to be performed.

19. The method of claim 16, wherein the bit cells are static bit cells.

20. The method of claim 19, wherein the integrated circuit includes a peripheral circuit, and further comprising:
 operating the peripheral circuit, during normal memory transactions, read margin test operations, and write margin test operations, at the same nominal voltage that the word-line driver and bit cells operate at during normal memory transactions.

\* \* \* \* \*

UNITED STATES PATENT AND TRADEMARK OFFICE
CERTIFICATE OF CORRECTION

PATENT NO. : 8,705,268 B2  
APPLICATION NO. : 13/337902  
DATED : April 22, 2014  
INVENTOR(S) : Buer et al.

Page 1 of 1

It is certified that error appears in the above-identified patent and that said Letters Patent is hereby corrected as shown below:

In the Claims

Column 14, line 41, claim 20, please delete "," between --circuit-- and --during--.

Signed and Sealed this  
Eighth Day of July, 2014

Michelle K. Lee  
*Deputy Director of the United States Patent and Trademark Office*